United States Patent [19]

Yamada

[11] Patent Number: 4,531,173
[45] Date of Patent: Jul. 23, 1985

[54] PROTECTIVE POWER FOLDBACK CIRCUIT FOR A POWER SEMICONDUCTOR

[75] Inventor: Noriyuki Yamada, Tokyo, Japan

[73] Assignee: Motorola, Inc., Schaumburg, Ill.

[21] Appl. No.: 548,058

[22] Filed: Nov. 2, 1983

[51] Int. Cl.³ .............................................. H02H 9/04
[52] U.S. Cl. ........................................ 361/86; 361/18
[58] Field of Search ....................... 361/18, 87, 93, 79, 361/86, 91; 323/22, 303; 330/207 P

[56] References Cited

U.S. PATENT DOCUMENTS

| | | | |
|---|---|---|---|
| 3,449,680 | 6/1969 | Schilb et al. | 307/202 X |
| 3,579,089 | 5/1971 | Giess | 323/22 |
| 3,641,451 | 2/1972 | Hollingsworth et al. | 330/134 |
| 3,852,669 | 12/1974 | Bowman et al. | 325/151 |
| 3,886,438 | 5/1975 | Bouman | 323/303 |
| 4,114,108 | 9/1978 | Faulkenberry et al. | 330/207 P |
| 4,355,341 | 10/1982 | Kaplan | 361/79 |
| 4,378,580 | 3/1983 | Stich | 361/91 |

*Primary Examiner*—A. D. Pellinen
*Assistant Examiner*—Hong K. Choe
*Attorney, Agent, or Firm*—James W. Gillman; Donald B. Southard; Raymond A. Jenski

[57] ABSTRACT

A protective power foldback circuit which protects a power semiconductor device from damage resulting from variations in load, supply voltage, and input drive power is disclosed. When the supply voltage exceeds a certain value, the drive power to the power device is reduced in an amount greater than that produced by the excess supply voltage thereby protecting the power device from the combined effects of load, supply voltage, and drive power.

15 Claims, 3 Drawing Figures

PROTECTIVE POWER FOLDBACK CIRCUIT FOR A POWER SEMICONDUCTOR

BACKGROUND OF THE INVENTION

Transistor power amplifiers, particularly radio frequency power amplifiers, are subject to damage due to "punchthrough" and other related phenomena caused by high voltage levels at the device collector. The narrow base width of a high frequency transistor can be bridged by the collector voltage generated space charge region of the collector-base junction and effectively short the collector to the emitter allowing large currents to flow.

Modern devices, when operated within their limits, can withstand high collector supply voltages in combination with instantaneous peak voltages created by load mismatch when the power transistor is driven by the preceding stage at the rated drive power. When the supply voltage for the preceding lower power stages is high, the resulting high drive power in conjunction with the power transistor high supply voltage and the load mismatch voltage will often cause the power transistor collector to reach the punchthrough voltage and cause device damage. The present invention provides, for the first time, power semiconductor device protection in consideration of these damaging combinational effects.

One traditional method of protecting power amplifier transistors via a feedback control loop employs directional couplers for independent forward and reverse power detection. Detection of excessive forward or reverse power and reducing drive or power device supply voltage has provided good device protection at relatively high cost.

Another traditional but lower cost feedback method eliminates direct power detection and substitutes the sensing of power transistor current or voltage for an indication of the power dissipation of the device. This sensed parameter is used to control the output power of the transistor and is usually implemented by controlling the drive to the power device.

The lower cost method works well under matched load conditions, but a mismatched load will create standing waves which may give an erroneous indication of device operation. This erroneous indication may give rise to the feedback loop causing an increase or decrease in output power depending upon the standing wave current or voltage value at the sensing point. Thus, a device in a feedback loop employing a current or voltage sensing method to maintain a constant power output can be subject to even greater drive than a device not placed in such a loop.

Accordingly, a primary object of this invention is to protect a power amplifier semiconductor device, inter alia, from punchthrough damage.

Another object of this invention is to further avoid damage caused by high supply voltage, high reflected power due to load mismatch, and high drive level.

Another object of this invention is to correlate the protection of the semiconductor device to the supply voltage.

A more particular object of this invention is to foldback the semiconductor device input drive power by an amount greater than that power produced by the supply voltage in excess of a predetermined value.

SUMMARY OF THE INVENTION

These and other objects are achieved in accordance with this invention of a power foldback circuit for a power semiconductor device which is subject to failure due to the combined effects of high reflected voltage from a mismatched load, high supply voltage, and high drive power from preceding stages. A comparison of the supply voltage applied to the power device and a stable reference voltage results in the generation of a foldback control signal when the supply voltage exceeds a certain value. The foldback control signal is coupled to a circuit preceding the power device to accomplish the reduction of drive power input to the power device by an amount greater than that produced by the excess supply voltage in the preceding stages. Consequently, the instantaneous voltage appearing across the power device is kept below damaging levels even when the power device is subject to the most severe combination of standing wave voltage from load mismatch, high supply voltage, and high drive power.

DETAILED DESCRIPTION

Figure 1:
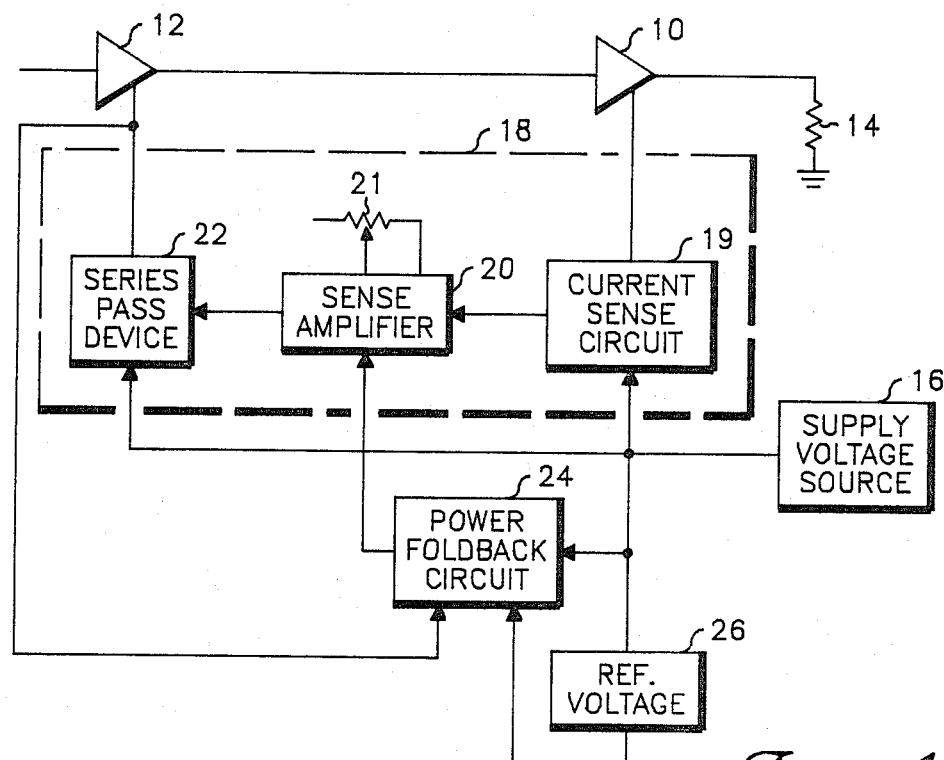
FIG. 1 is a block diagram depicting a typical power amplifier with a power control loop and the protective power foldback circuit of the present invention.

Referring now to the drawings, the present invention is incorporated into the power amplifier and power control loop as illustrated in FIG. 1. In this realization, a power amplifier device 10 receives its signal drive from driver 12 and terminates in a load 14. Load 14 can represent an antenna in a radio frequency transmitter which may be broken or damaged in such a way that its impedance no longer matches that of the power amplifier. As a result, voltage peaks and nulls appear along the transmission line between the amplifier and the antenna.

The current drawn by the power amplifier device 10, which is representative of the forward power output with a matched load, is sampled by the current sense circuit 19. The sample is compared to an adjustable reference 21 in a sense amplifier 20 and the resultant level is applied to a control terminal of a series pass device 22. The series pass device 22 controls the value of the voltage supplied to driver 12 from a supply voltage source 16 in response to the signal applied to the series pass device 22 control terminal. The voltage applied to driver 12 directly affects the value of the drive power input to the power amplifier device 10. Thus, in a feedback loop, the adjustable reference 21 of sense amplifier 20 establishes a power amplifier device 10 output power such that the sample of current drawn by the power amplifier device 10 is in equilibrium with the adjustable reference 21 of sense amplifier 20. For most applications, this feedback loop performs well in maintaining a constant power output over voltage and environmental changes.

The current sense power control loop, however, cannot provide an accurate representation of forward power output under the high voltage standing wave conditions caused by load 14 mismatch. A large variation of load impedance changes the relationship between the forward power and the power amplifier device 10 current upon which the control loop depends. The result is a large variation in drive to the power amplifier device and, therefore, a large variation in output power.

Fortunately, modern radio frequency devices are designed ruggedly enough to withstand load changes at high supply voltage at rated drive. However, because the preceding stages generally utilize the same supply voltage source, these stages produce higher drive power concurrent with high supply voltage. Thus, the potential exists to overdrive the power amplifier device. This overdrive, combined with high supply voltage and high standing waves, generally results in permanent power amplifier device damage.

To prevent power amplifier device damage, a power foldback circuit 24 in the preferred embodiment is combined with the traditional power control feedback loop 18, comprised of current sense circuit 19, sense amplifier 20, adjustable reference 21, and series pass device 22. The supply voltage is input to the power foldback circuit 24 and compared to a reference voltage 26. When the supply voltage exceeds a predetermined value relative to the reference voltage 26, an output signal called a foldback control signal is input to the sense amplifier 20. The foldback control signal overrides the current sample from the current sense circuit 19 and causes the sense amplifier 20 and series pass device 22 to reduce the control voltage supplied to driver 12. This control voltage is also returned to the power foldback circuit 24 to complete the power foldback loop.

The power foldback circuit 24 produces no effect until the supply voltage exceeds a value determined to provide continuing safe operating conditions. When the supply voltage exceeds this value, the foldback control signal causes the drive power to be reduced by an amount greater than the incremental drive power produced by the amount of supply voltage in excess of the predetermined value.

Figure 2:
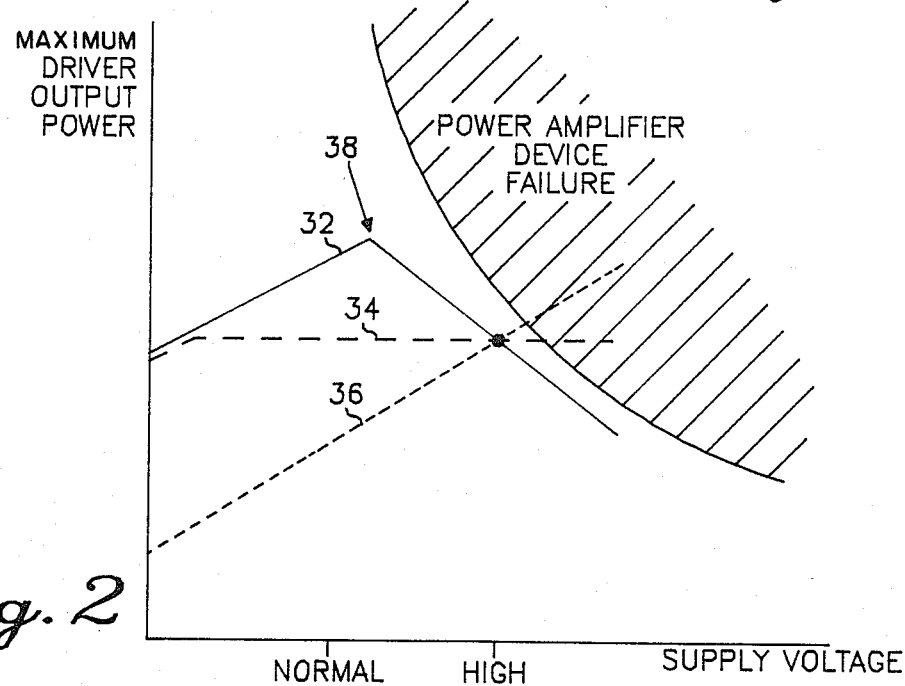
FIG. 2 is a graph relating supply voltage to the maximum output power of the driver stage of FIG. 1.

The drive power foldback performance is compared to that of other forms of drive power control as shown in FIG. 2. The driver output response to supply voltage while under the control of a power foldback loop is represented by curve 32. Similar performance curves based on the more traditional methods of controlling the drive power are shown as curve 34 for the method of limiting the driver supply voltage and curve 36 for the method of limiting the driver supply current. It can be seen that over much of the operating supply voltage range the foldback circuit allows a higher driver output power than traditional control methods and provides, at higher supply voltages, a decreasing driver output power with increasing supply voltage thereby preventing power amplifier device damage from excess drive power.

Figure 3:
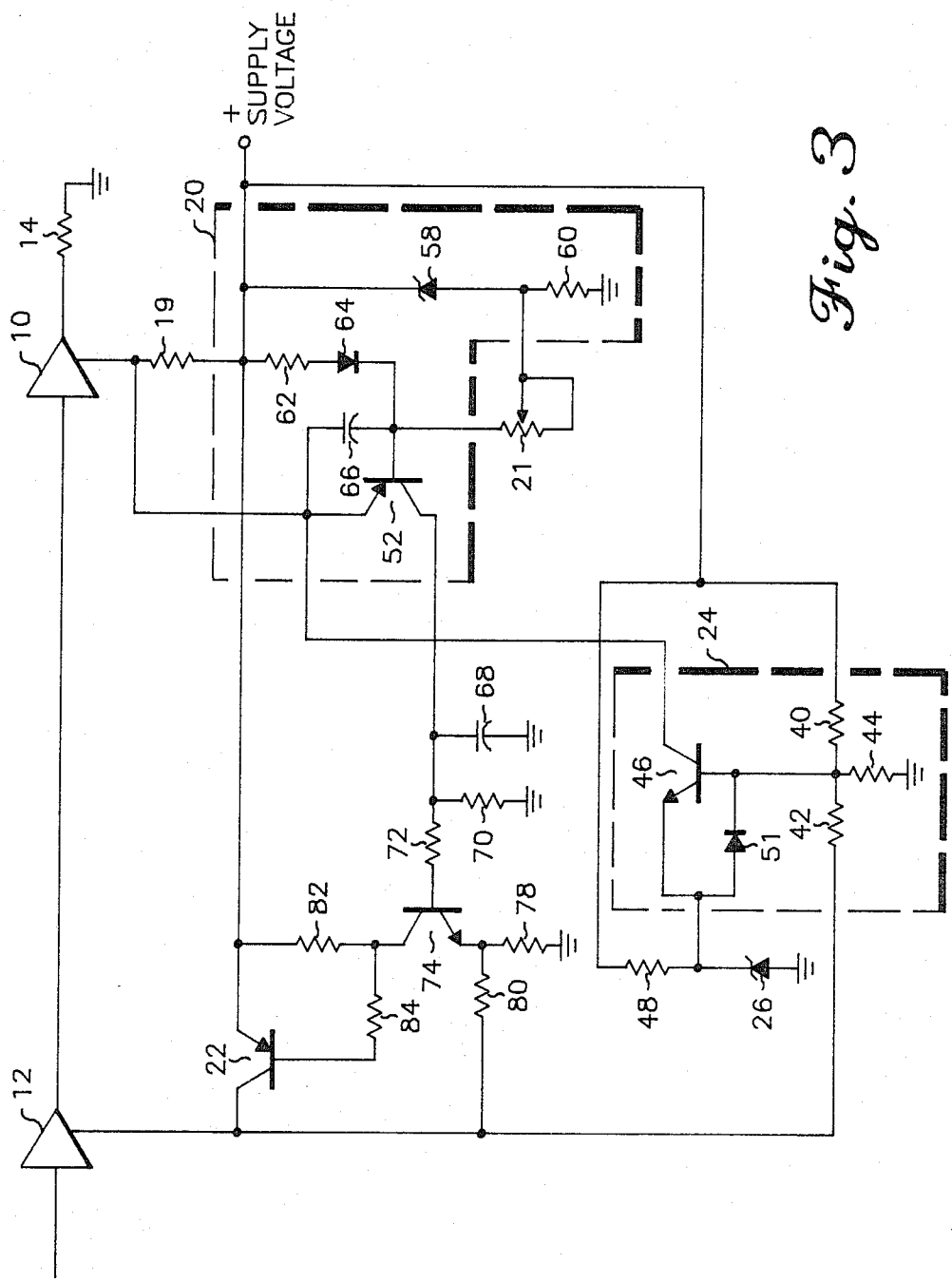
FIG. 3 is a more detailed schematic diagram of the power control and power foldback circuit shown in FIG. 1.

The commencement of power foldback operation, indicated by slope change 38, must occur at a point which prevents the power amplifier device collector voltage from reaching destructive levels. Contributors to collector voltage under operating conditions are supply voltage, signal voltage excursions, and standing wave voltage. The worst case combinations of these voltages are used to determine the voltage of commencement point 38 and rate of drive power foldback necessary to keep the combined voltage below the punchthrough voltage. In the preferred embodiment of the invention, the power foldback commencement point 38 and the rate amount of power foldback are determined by resistors 40, 42 and 44, shown in FIG. 3. FIG. 3 reveals more detail of the traditional power control feedback loop 18 and the power foldback circuit 24 shown in block form in FIG. 1.

In combination the three resistors 40, 42, and 44 provide the base voltage to comparator transistor 46 of power foldback circuit 24. The resistor 48, connected to the supply voltage, and the zener 26 connected to ground, establish the previously described reference voltage which is applied to the comparator transistor 46. Emitter diode 51 prevents reverse voltage damage to the comparator transistor 46.

The foldback control signal is generated at the collector of comparator transistor 46 as a result of the interaction between base voltage and emitter voltage. The foldback control signal is connected directly to transistor 52 which is the active device of sense amplifier 20 and part of the traditional power control feedback loop 18. The control voltage to the driver 12 is returned to the power foldback circuit by way of resistor 42 and completes the power foldback loop.

In operation as the supply voltage increases, the sample of supply voltage, determined primarily by resistors 40 and 44, increases. When the supply voltage sample exceeds the voltage sum of comparator transistor 46 $V_{BE}$ and the reference voltage established by zener diode 26, the comparator transistor 46 is turned on and the collector voltage, forming the foldback control signal, changes to a new value. The traditional power control feedback loop 18, in response to the foldback control signal, reduces the drive power in an amount greater than the incremental drive power produced by the excess supply voltage by reducing the driver 12 control voltage to a value that provides equilibrium at the resistor network of 40, 42, and 44. The power foldback commencement point 38 and the rate of power foldback change with excess supply voltage are determined by this resistor network.

The values of resistor 40, 42 and 44 are established in accordance with the formula $V_S G_{40} + V_C G_{42} = V_R (G_{40} + G_{42} + G_{44})$, where $V_S$ is the supply voltage, VC is the control voltage, $V_R$ is the reference voltage, $G_{40}$ is the conductance value of resistor 40, $G_{42}$ is the conductance value of resistor 42, and $G_{44}$ is the conductance value of resistor 44.

The power control feedback loop 18 used in this embodiment is typical of such loops and operates in the following manner. The current drawn by power amplifier device 10, which is related to output power with a matched load, develops a DC voltage across resistor 19 which is subsequently coupled to transistor 52. The base of transistor 52 is connected to a reference voltage established by zener 58 and resistor 60 via an adjustable reference or "power adjust" potentiometer 21. The output of transistor 52 depends upon the relation of the voltage developed across resistor 19 and the reference voltage as adjusted by "power adjust" potentiometer 21. Resistor 62 and diode 64 provide a temperature stabilized bias to the base of transistor 52. Capacitor 66 and 68 prevent regeneration. The output of transistor 52 is coupled to the series pass driver transistor 74 via a bias network made up of resistors 70 and 72. Resistors 78 and 80 establish the operating point of series pass driver 74. The output of series pass driver 74 provides base current by way of resistors 82 and 84 to the series pass transistor 22. Series pass transistor 22 provides a control voltage to driver 12 which is proportional to the output of transistor 52. This control voltage which is the supply voltage for the driver stage 12 controls the drive power output from the driver 12. The power amplifier device 10 amplifies the drive power and presents it to load 14. Therefore, an increase in the power output above an equilibrium point established by "power adjust" potentiometer 21 results in the reduction of drive power to the power amplifier such that the output of power amplifier device 10 is reduced to the equilibrium point. Conversely, a decrease in power output from the power amplifier device 10 is met with an increase in drive power to increase the output of the power amplifier device 10 to regain the equilibrium point.

Protection for a power semiconductor device is provided by the power foldback circuit of this invention. Prevention of power semiconductor device damage from the combined effects of load mismatch, high supply voltage, and high drive power is achieved by reducing the drive power in a novel manner.

What is claimed is:

1. A protective power foldback circuit for a power semiconductor device which may otherwise be adversely affected by variations of load, supply voltage, and drive power thereto, comprising:
    means for generating a reference voltage;
    means for sampling the supply voltage applied to the power semiconductor device;
    means for comparing said reference voltage and said sampled supply voltage and generating a foldback control signal in response to an excess of applied supply voltage; and
    means for reducing the drive power applied to the power semiconductor device by a predetermined amount greater than that produced by said excess of applied supply voltage in response to said foldback control signal.

2. A protective power foldback circuit in accordance with claim 1, wherein said power semiconductor device is a transistor.

3. A protective power foldback circuit in accordance with claim 1, wherein said reference voltage is developed across a zener diode.

4. A protective power foldback circuit in accordance with claim 1, wherein said supply voltage applied to said power semiconductor device is sampled via a resistive voltage divider.

5. A protective power foldback circuit in accordance with claim 1, wherein a transistor comparator is used to compare said reference voltage, applied at one terminal, and said sampled supply voltage, applied at a second terminal, to generate a foldback control signal at a third terminal.

6. A protective power foldback circuit in accordance with claim 1, wherein said reducing means is a driver stage with variable output power responsive to supply voltage applied to said previous active stage.

7. A protective power foldback circuit for a power semiconductor device, incorporated in an output power control loop generating a control voltage, which may otherwise be adversely affected by variations of load, supply voltage, and drive power thereto, comprising:
    means for generating a reference voltage;
    means for sampling the supply voltage applied to the power semiconductor device;
    means for sampling the control voltage;
    means for summing said sampled supply voltage and said sampled control voltage in predetermined proportions;
    means for comparing said summed output to said reference voltage and generating a foldback control signal in response to an excess of applied supply voltage; and
    means for reducing the drive power applied to the power semiconductor device by a predetermined amount greater than that produced by said excess of applied supply voltage in response to said foldback control signal input to the power control loop.

8. A protective power foldback circuit in accordance with claim 7, wherein said power semiconductor device is a transistor.

9. A protective power foldback circuit in accordance with claim 7, wherein said reference voltage is developed across a zener diode.

10. A protective power foldback circuit in accordance with claim 7, wherein said supply voltage and said control voltage are sampled in predetermined proportions and summed in a resistive network.

11. A protective power foldback circuit in accordance with claim 7, wherein a transistor comparator is used to compare said reference voltage, applied at one terminal, and said summed output, applied at a second terminal, to generate a foldback control signal at a third terminal.

12. A method of protective power foldback for a power semiconductor device which may otherwise be adversely affected by variations in load, supply voltage, and drive power thereto comprising the steps of:
    generating a reference voltage;
    sampling the supply voltage applied to the power semiconductor device;
    comparing said reference voltage to said sampled supply voltage and generating a foldback control signal in response to an excess of applied supply voltage; and
    reducing said drive power to said power semiconductor device by a predetermined amount greater than that produced by said excess of applied supply voltage.

13. A method of protective power foldback in accordance with claim 12 wherein comparing said reference voltage to said sampled supply voltage is further comprised of the steps:
    applying said reference voltage to a first terminal of a transistor comparator;
    applying said sampled supply voltage to a second terminal of a transistor comparator; and
    generating a foldback control signal at a third terminal of a transistor comparator.

14. A method of protective power foldback for a power semiconductor device, incorporated in an output control loop generating a control voltage, which may otherwise be adversely affected by variations in load, supply voltage, and drive power thereto comprising the steps of:
    generating a reference voltage;
    sampling the supply voltage applied to the power semiconductor device;
    sampling the control voltage;
    summing said sampled supply voltage and said sampled control voltage in predetermined proportions;
    comparing said summed output to said reference voltage and generating a foldback control signal in response to an excess of applied supply voltage; and reducing the drive power applied to the power semiconductor device by a predetermined amount greater than that produced by said excess of supply voltage and in response to said foldback control signal input to the power control loop.

15. A method of protective power foldback in accordance with claim 14, wherein comparing said reference voltage to said summed output is further comprised of the steps:

applying said reference voltage to a first terminal of a transistor comparator;

applying said summed output to a second terminal of a transistor comparator; and generating a foldback control signal at a third terminal of a transistor comparator.

* * * * *